United States Patent
Greenwood et al.

(10) Patent No.: US 6,835,453 B2
(45) Date of Patent: Dec. 28, 2004

(54) CLEAN RELEASE, PHASE CHANGE THERMAL INTERFACE

(75) Inventors: Alfred W. Greenwood, Salem, NH (US); Michael H. Bunyan, Chelmsford, MA (US); Kent M. Young, Carlisle, MA (US); Deanna J. Wright, Wilmington, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 148 days.

(21) Appl. No.: 10/045,924

(22) Filed: Jan. 14, 2002

(65) Prior Publication Data

US 2002/0135984 A1 Sep. 26, 2002

Related U.S. Application Data

(60) Provisional application No. 60/263,258, filed on Jan. 22, 2001, and provisional application No. 60/309,552, filed on Aug. 2, 2001.

(51) Int. Cl.[7] .......................... B32B 25/08; B32B 27/30; B32B 27/32; B32B 27/36
(52) U.S. Cl. ...................... 428/343; 428/40.1; 428/40.2; 428/40.9; 428/344; 428/346; 428/356; 361/709
(58) Field of Search ............................... 428/40.1–42.3, 428/344, 346, 356, 343; 361/709

(56) References Cited

U.S. PATENT DOCUMENTS

| | | |
|---|---|---|
| 2,311,526 A | 2/1943 | Ferguson et al. |
| 3,332,055 A | 7/1967 | Bogner |
| 3,404,061 A | 10/1968 | Shane et al. |
| 3,609,104 A | 9/1971 | Ehrreich et al. |
| 3,928,907 A | 12/1975 | Chisholm |
| 4,299,715 A | 11/1981 | Whitfield et al. |
| 4,384,610 A | 5/1983 | Cook et al. |
| 4,389,340 A | 6/1983 | Levy |
| 4,466,483 A | 8/1984 | Whitfield et al. |
| 4,473,113 A | 9/1984 | Whitfield et al. |
| 4,487,856 A | 12/1984 | Anderson et al. |
| 4,533,685 A | 8/1985 | Hudgin et al. |
| 4,546,411 A | 10/1985 | Kaufman |
| 4,561,011 A | 12/1985 | Kohara et al. |
| 4,575,432 A | 3/1986 | Lin et al. |
| 4,602,678 A | 7/1986 | Fick |
| 4,654,754 A | 3/1987 | Daszkowski |
| 4,685,987 A | 8/1987 | Fick |
| 4,722,960 A | 2/1988 | Dunn et al. |
| 4,755,249 A | 7/1988 | DeGree et al. |
| 4,764,845 A | 8/1988 | Artus |
| 4,782,893 A | 11/1988 | Thomas |
| 4,842,911 A | 6/1989 | Fick |
| 4,855,002 A | 8/1989 | Dunn et al. |
| 4,869,954 A | 9/1989 | Squitieri |
| 4,915,167 A | 4/1990 | Altoz |
| 4,965,699 A | 10/1990 | Jorden et al. |
| 4,974,119 A | 11/1990 | Martin |
| 4,979,074 A | 12/1990 | Morley et al. |

(List continued on next page.)

FOREIGN PATENT DOCUMENTS

| | | |
|---|---|---|
| EP | 0 732 743 | 9/1996 |
| EP | 1 067 164 | 1/2001 |
| JP | 5-138396 | 6/1993 |

OTHER PUBLICATIONS

U.S. Provisional application No. 60/263,259, Bunyan et al, filed Jan. 22, 2001.

(List continued on next page.)

Primary Examiner—William P. Watkins, III
Assistant Examiner—Brian P. Egan
(74) Attorney, Agent, or Firm—John A. Molnar, Jr.

(57) ABSTRACT

A laminar, thermally-conductive interface interposable intermediate a first heat transfer surface and an opposing second heat transfer surface to provide a thermally-conductive pathway therebetween. The interface includes a first layer formed of a flexible, lamellar graphite or tin foil material, and a second layer formed of a thermally-conductive phase-change material.

72 Claims, 2 Drawing Sheets

U.S. PATENT DOCUMENTS

| | | | |
|---|---|---|---|
| 5,052,481 A | 10/1991 | Horvath et al. | |
| 5,060,114 A | 10/1991 | Feinberg et al. | |
| 5,061,549 A | * 10/1991 | Shores | 428/209 |
| 5,100,737 A | * 3/1992 | Colombier et al. | 428/612 |
| 5,137,959 A | 8/1992 | Block et al. | |
| 5,167,851 A | 12/1992 | Jamison et al. | |
| 5,194,480 A | 3/1993 | Block et al. | |
| 5,213,868 A | 5/1993 | Liberty et al. | |
| 5,250,209 A | 10/1993 | Jamison et al. | |
| 5,298,791 A | 3/1994 | Liberty et al. | |
| 5,302,344 A | 4/1994 | Perlman | |
| 5,321,882 A | 6/1994 | Zaroui et al. | |
| 5,352,731 A | 10/1994 | Nakano et al. | |
| 5,372,883 A | 12/1994 | Shores | |
| 5,471,027 A | 11/1995 | Call et al. | |
| 5,533,256 A | 7/1996 | Call et al. | |
| 5,545,473 A | 8/1996 | Ameen et al. | |
| 5,602,221 A | 2/1997 | Bennett et al. | |
| 5,679,457 A | 10/1997 | Bergerson | |
| 5,770,318 A | 6/1998 | Friedman | |
| 5,781,412 A | 7/1998 | de Sorgo | |
| 5,796,582 A | 8/1998 | Katchmar | |
| 5,798,171 A | 8/1998 | Olson | |
| 5,930,893 A | 8/1999 | Eaton | |
| 5,944,322 A | 8/1999 | Coff et al. | |
| 5,945,217 A | 8/1999 | Hanrahan | |
| 6,054,198 A | 4/2000 | Bunyan et al. | |
| 6,090,484 A | * 7/2000 | Bergerson | 428/355 EN |
| 6,372,997 B1 | 4/2002 | Hill et al. | |
| 6,433,069 B1 | * 8/2002 | Oeltjen et al. | 524/505 |

OTHER PUBLICATIONS

U.S. Provisional application No. 60/309,552, Bunyan et al., filed Aug. 2, 2001.

Pal D, et al: "Application of Phase Change Materials to Thermal Control of Electronics Modules: A Computational Study" Advances in Electronic Packaging. Proceedings ASME International Electronics P Conference. New York, NY US, vol. 10–2 Mar. 26, 1995, pp. 1207–1315, the entire document.

Copy of International Search Report in corresponding PCT Application No. PCT/US01/50074.

Copy of International Application Pubilshed Under the Patent Cooperation Treaty No. WO 96/37915.

Copy of International Application Published Under the Patent Cooperation Treaty No. WO 97/41599.

Copy of International Application Published Under the Patent Cooperation Treaty No. WO 97/41599.

Article entitled Thermally Conductive Adhesives for Electronic Packaging, authored by Carol Latham, President of Thermagon, Inc. dated Jul. 1991.

Letter dated Jul. 25, 2000 from Eugene Lieberstein of Anderson Kill & Olick, P.C.

Invoices dated May 15, 1992 and Jul. 6, 1993 of Thermagon, Inc.

Technical Data Sheet Ablefilm® 5025E, dated Mar., 1992 of Ablestik, entitled Electrically Conductive Adhesive Flm.

Technical Data Sheet Ablefilm® 563K, dated Nov., 1995 of Ablestik, entitled Thermally Conductive Adhesive Film.

Technical Data Sheet Ablefilm® 566K, dated Nov., 1995 of Ablestik, entitled Low Temperature Cure Adhesive Film.

Article entitled T–gon 100 Series, Thermally Conductive Epoxy Adhesive Films, dated Jun. 10, 1997 of Thermagon, Inc.

AI Technology Data Sheet for Cool–Pad TP7105, revised Feb., 1992.

AI Technology Data Sheet for Cool–Pad TP7608, revised Feb., 1992.

AI Technology Data Sheet for Cool–Pad TP7208, revised Feb., 1992.

AI Technology Data Sheet for Cool–Paid TP7205, revised Feb., 192.

AI Technology Data Sheet for Thermoplastic TP7165, revised Oct., 1994.

AI Technology Data Sheet for Cool–Pad TP7605, revised Oct., 1994.

AI Technology Data Sheet for Cool–Pad TP7609, revised Aug. 12, 2000.

Article authored by L–M Leung and K. K. T. Chung entitled Zero–stress Film Adhesive for Substrate Attach, published in Hybrid Circuits No. 18, Jan. 1989.

Letter dated Aug. 17, 2000 from Clement A. Berard of Dann. Dorfman, Herrell & Skillman.

Thermal Products Group—Grease Replacement Products To Support Pentium and Pentium II Applications Sep. 16, 1998.

IBM Technical Disclosure Bulletin, vol. 25, No. 11A Apr. 1983 Flexible Heat–Conducting Sheet Material For Semiconductor Packages, R. H. Lacombe and H. Lee.

IBM Technical Disclosure Bulletin, vol. 24, No. 12 May 19 Chip Cooling Employing Alloys Having Different Solidus Temperature, J. K. Hassan, S. Oktay and J. Paivanas.

IBM Technical Disclosure Bulletin, vol. 27, No. 7A Dec. 1984 Cooling Assembly For Solder–Bonded Semiconductor Devices—J. L. Horvath.

IBM Technical Disclosure Bulletin, vol. 35, No. 7 Dec. 1992 Thermally Conductive, Reworkable, Elastomeric Interposer For Chip–to–Heat Sink Attachment.

AI Technology Invoice No. 6420 dated Feb. 12, 1993.

AI Technology Invoice No. 7344 dated Aug. 27, 1993.

AI Technology Invoice No. 5657 dated Sep. 14, 1992.

AI Technology Invoice No. 4580 dated Mar. 24, 1993.

AI Technology Invoice No. 5370 dated Jul. 27, 1992.

AI Technology Invoice No. 4964 dated May 27, 1992.

AI Technology Invoice No. 8303 dated Mar. 18, 1994.

AI Technology Invoices No. 8789 dated Jul. 18, 1994.

ORCUS inc. THERMAPHASE—Thermal Interface Materials for Electronics: Unique Characteristics, Lowest Thermal Resistance.

Technical Bulletin #77 Chomerics—CHO–Therm Thermal Interface Materials 1997.

Technical Bulletin #78 Chomerics—CHO–Therm Thermal Interfaces Materials 1998.

*Packaging Ideas*, Edited by Howard Markstein, Interface Materials Offer Heat Transfer and Isolation.

EARL'S Pressure Master—Engine Gaskets Seals—1996 Earl's Performance Products.

* cited by examiner

CLEAN RELEASE, PHASE CHANGE THERMAL INTERFACE

CROSS-REFERENCE TO RELATED CASES

The present application claims the benefit of the filing date of U.S. Provisional Application Ser. No. 60/263,258; filed Jan. 22, 2001 and U.S. Provisional Application Ser. No. 60/309,552; filed Aug. 2, 2001.

BACKGROUND OF THE INVENTION

The present invention relates broadly to thermal management materials for electronic devices. Such materials commonly are used as heat transfer interfaces between, for example, the mating heat transfer surfaces of a heat-generating, electronic component, such as an integrated circuit (IC) chip, and a thermal dissipation member, such as a heat sink or spreader, for the conductive cooling of the electronic component. More particularly, the present invention relates to a laminar, thermally-conductive interface which is formed as a laminate of a first layer of a conformable phase-change material and a second layer of a flexible, lamellar graphite material or, alternatively, a tin foil material. The first layer, which may be formulated to be inherently tacky or otherwise adherable to the heat transfer surface of the dissipation member, is form stable in a first phase at normal room temperature but conformable to the heat transfer surface in a second phase within the operating temperature of the electronic component to provide a low thermal impedance interface with the dissipation member. The second layer, in turn, is relatively compressible and thereby also relatively conformable to the heat transfer surface of the electronic component to provide a low thermal impedance interface therewith. However, the second layer is cleanly removable, i.e., without substantial residue, from the surface of the component for rework or otherwise.

Circuit designs for modem electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmicly or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

That is, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a pad or other layer of a thermally-conductive, electrically-insulating material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

The greases and waxes of the aforementioned types heretofore known in the art, however, generally are not self-supporting or otherwise form stable at room temperature and are considered to be messy to apply to the interface surface of the heat sink or electronic component. To provide these materials in the form of a film which often is preferred for ease of handling, a substrate, web, or other carrier must be provided which introduces another interface layer in or between which additional air pockets may be formed. Moreover, use of such materials typically involves hand application or lay-up by the electronics assembler which increases manufacturing costs.

Alternatively, another approach is to substitute a cured, sheet-like material in place of the silicone grease or wax. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics TEC Division of Parker-Hannifin Corp., 16 Flagstone Drive, Hudson, N.H. 03051. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1–50 microns (0.05–2 mils).

Sheets, pads, and tapes of the above-described types have garnered general acceptance for use as interface materials in the conductive cooling of electronic component assemblies such as the semiconductor chips, i.e., dies, described in U.S. Pat. No. 5,359,768. In certain applications, however, heavy fastening elements such as springs, clamps, and the like are required to apply enough force to conform these materials to the interface surfaces in order to attain enough surface for efficient thermal transfer. Indeed, for some applications, materials such as greases and waxes which liquefy, melt, or soften at elevated temperature continue to be preferred as better conforming to the interface surfaces under relatively low clamping pressures.

Recently, phase-change materials have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These phase-change materials, which may be supplied as free-standing films, or as heated screen printed onto a substrate surface, advantageously function much like greases and waxes in conformably flowing within the operating temperature of the component under relatively low clamping pressures of about 5 psi (35 kPa). Such materials are further described in commonly-assigned U.S. Pat. No. 6,054,198, and are marketed commercially under the names THERMFLOW™ T310, T443, T705, T710, T725, and A725 by the Chomerics TEC Division of Parker-Hannifin Corp., 16 Flagstone Drive, Hudson, N.H. 03051. Other phase-change materials are marketed commercially by the Bergquist Company (Minneapolis, Minn.) under the tradename "HI-FLOW™," by Thermagon, Inc. (Cleveland, Ohio) under the tradenames "T-PCM™" and by Orcus, Inc. (Stilwell, Kans.) under the tradename "THERMAPHASE." A phase-change material/metal foil laminate is marketed by Thermagon, Inc. under the tradename "T-MATE™."

For typical commercial application, the thermal interface material may be supplied in the form of a tape or sheet which includes an inner and outer release liner and an interlayer of thermal compound. Unless the thermal compound is inherently tacky, one side of the compound layer may be coated with a thin layer of a pressure-sensitive adhesive (PSA) for the application of the compound to the heat transfer surface of a heat sink. In order to facilitate automated dispensing and application, the outer release liner and compound interlayer of the tape or sheet may be die cut to form a series of individual, pre-sized pads. Each pad thus may be removed from the inner release liner and bonded to the heat sink using the adhesive layer in a conventional "peel and stick" application which typically is performed by the heat sink manufacturer.

With the pad being adhered to the heat transfer surface of the thermal dissipation member such as a heat sink or spreader, and with the outer liner in place to form a protective cover the outer surface of the compound layer, the dissipation member and pad may be provided as an integrated assembly. Prior to installation of the assembly, the outer release liner is removed from the compound layer, and the pad positioned on the electronic component. A clamp may be used to secure the assembly in place.

It will be appreciated, however, that further improvements in thermal interfaces and in the materials therefor would be well-received by the electronics industry. In this regard, certain applications may dictate that the interface be cleanly removable, i.e., without substantial residue of its constituent materials, from the surface of the electronic component for rework, repositioning, or other disassembly. Especially desired therefore would be a thermal interface pad, sheet, or the like which is conformable upon being heated in service to provide a low thermal impedance but which is also cleanly releasable after service from the surface of the electronic component for rework, repositioning, or other disassembly.

BROAD STATEMENT OF THE INVENTION

The present invention is directed to a thermal interface for a thermal management assembly involving, for example, a heat source such as an electronic chip or other heat-generating component and a thermal dissipation member such as a heat sink or spreader disposable in thermal adjacency with the electronic component for the conduction of heat therebetween. Particularly, the invention is directed to an interface, such as in the form of a sheet or pad, which is conformable to the interfacing surface of the electronic component and the heat sink or spreader to provide a low thermal impedance across the assembly, but which also is cleanly releasable from the electronic component for rework, repositioning, or other disassembly.

Heretofore, interfaces of the type herein involved formed of materials of the phase-change variety generally were not specified for applications dictating a clean removal from the electronic component. In this regard, as a result of the flow of the phase-change material when the interface is heated to a temperature within the operating temperature of the electronic component, the interface was not able to be cleanly released from the component. Rather, solvents or mechanical means such as scraping were required to be employed to clean the component for rework or the like.

The interface of the present invention, in being formed as a laminate of a first layer formed of a flexible, lamellar graphite material or, alternatively, a tin foil material, disposable in heat transfer contact with a heat transfer surface of the electronic component, and a second layer formed of a phase-change material disposable in heat transfer contact with a heat transfer surface of a dissipation member such as a heat sink or spreader, is both conformable to the surfaces of the dissipation member and the component. However, as a result of the first layer being formed of the graphite or tin material which does not substantially flow under the temperatures and pressures herein involved, the interface therefore is cleanly removable from the surface of the electronic component without resort to chemical or mechanical means.

Advantageously, the interface of the present invention may be removed with the heat sink or spreader from heat transfer contact with the electronic component without having to wait for the component to cool, thus speeding manufacturing and rework such as in the case of a problem with the initial burn-in of a microprocessor. Moreover, even after heating, the component and heat sink or spreader may be separated easily with little or no force with the attendant elimination of any substantial stress that otherwise would be placed on the component. In contrast, even if conventional PCM's could be released cleanly from the component, appreciable force nonetheless is required to break the vacuum developed as the PCM wets the surface of the component.

Unexpectedly, it has been observed that a layer of a flexible, lamellar graphite material may be used in conjunction with a phase-change material (PCM) to provide a very low thermal impedance, but cleanly releasable interface. In this regard, it is speculated that the flexible graphite material exhibits some degree of compressibility to allow it to better conform to the surface of the electronic component and to thereby lower the thermal contact resistance therebetween with the overall effect of improved heat transfer performance as compared to a metal-PCM laminate.

Alternatively, a thin layer of a tin foil material may be substituted for the graphite material. As compared to metal-PCM laminates conventionally based on aluminum foil materials, the tin-PCM laminates of the present invention exhibits a markedly lower thermal impedance and correspondingly improved heat transfer performance. Such improved performance is believed to be surprising insofar as the thermal conductivities of aluminum materials are generally known and reported to be higher than those for tin materials, e.g., about 200 W/m-K for aluminum versus about 60 W/m-K for tin. Thus, aluminum-PCM laminates generally would be expected to out-perform tin-PCM laminates in the thermal interface applications herein involved. Experimental testing, however, has revealed the opposite to be true. As additional advantages, by using thin gauge tin foils, the tin-PCM laminates of the present invention may be provided to be relatively thin and flexible, and are easier to manufacture and may be produced at a reduced cost as compared to other materials.

In an illustrative embodiment, the PCM of the second layer is form-stable in a first phase at normal room temperature but conformable, as being melted or otherwise softened, to the heat transfer surface in a second phase at an elevated temperature or range within the operating temperature of the electronic component to provide a low thermal impedance contact with the dissipation member even under relatively low clamping forces. Particularly, the PCM may be formulated as an admixture of a polymeric component and one or more thermally-conductive fillers. The polymeric component may be a resin such as a pressure-sensitive adhesive (PSA) or thermoplastic hot-melt, a paraffinic or other wax, a blend of one or more resins or one or more waxes, or a blend of one or more resins and one or more waxes. Preferably, the polymeric component is formulated to be inherently tacky to enable the interface to be bondable at room temperature to the surface of the heat sink, spreader, or the like without the necessity of heating or the provision of a separate pressure-sensitive adhesive (PSA) or other adhesive layer. The thermally-conductive filler, which may be provided as flakes, fibers, particles, or other particulate loaded at between 20–80% by weight, may be boron nitride, titanium diboride, aluminum nitride, silicon carbide, graphite, a metal such as silver, aluminum or copper, a metal oxide such as aluminum oxide, magnesium oxide, zinc oxide, beryllium oxide, or antimony oxide, or a mixture thereof. The flexible, lamellar graphite material of the first layer, in turn, may be intercalated graphite flakes which are heated and then molded, calendered, or otherwise formed into a sheet. The PCM may be coated onto a sheet of the graphite or tin foil materials herein involved, or otherwise bonded thereto by laminating under conditions of elevated heat and/or pressure.

The present invention, accordingly, comprises the combination of elements and arrangement of parts and steps which are exemplified in the detailed disclosure to follow. Advantages of the present invention include a thermal interface which is conformable for lower contact resistance and more efficient heat transfer between, for example, an electronic component and a heat sink, spreader, or other dissipation member within a thermal management assembly, but which also is cleanly releasable from the surface of the electronic component for rework, repositioning, or other disassembly. Further advantages include a thermal interface including a PCM which may be supplied in the form of a sheet, tape, or pad, and which is form-stable at room temperature for ease of handling and use. Still other advantages include a thermal interface material having a clean break capability from the electronic component which is not temperature dependent. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "interior," "inner," or "inboard" and "outward," "exterior," "outer," or "outboard" referring, respectively, to directions toward and away from the center of the referenced element, and the terms "radial" and "axial" referring, respectively, to directions perpendicular and parallel to the central longitudinal axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the illustrative purposes of the discourse to follow, the clean release interface of the invention herein involved is described in connection with its use within a thermal management assembly as a pad adhered to a heat transfer surface of a thermal dissipation member such as a heat sink for heat transfer contacting with a mating heat transfer surface of a electronic component. Such assemblies and thermal interface materials therefor are elsewhere described in U.S. Pat. Nos. 6,096,414; 6,054,198; 5,798,171; 5,766,740; 5,679,457; 5,545,473; 5,533,256; 5,510,174; 5,471,027; 5,359,768; 5,321,582; 5,309,320; 5,298,791; 5,250,209; 5,213,868; 5,194,480; 5,137,959; 5,167,851; 5,151,777; 5,060,114; 4,979,074; 4,974,119; 4,965,699; 4,869,954; 4,842,911; 4,782,893; 4,764,845; 4,685,987; 4,654,754; 4,606,962; 4,602,678; 4,473,113; 4,466,483; 4,299,715; and 3,928,907. It will be appreciated, however, that aspects of the present invention, which alternatively may be provided in the form of a tape or sheet, may find use in other thermal management applications. Use within those such other applications therefore should be considered to be expressly within the scope of the present invention.

Figure 1:
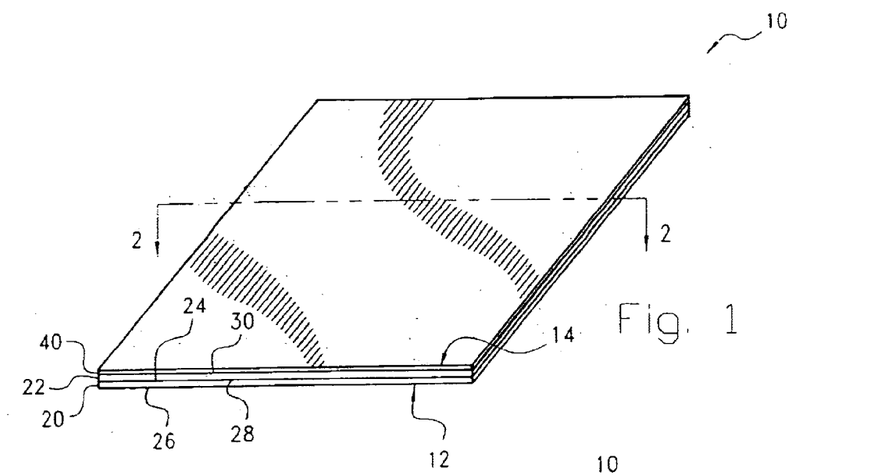
FIG. 1 is a perspective view of a representative thermal interface pad in accordance with the present invention.
Figure 2:
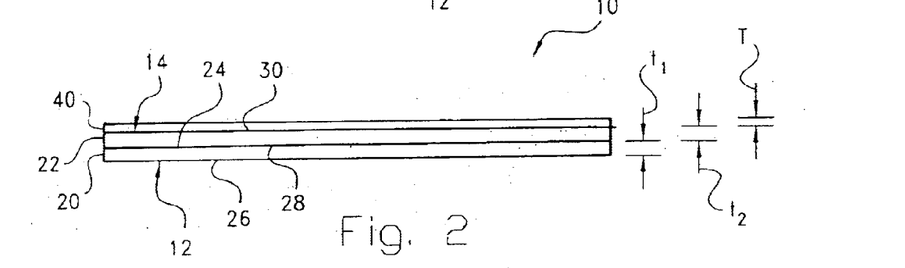
FIG. 2 is a cross-sectional view of the thermal interface pad of FIG. 1 taken through line 2—2 of FIG. 1.

Referring then to the drawings wherein corresponding reference numbers are used to designate corresponding elements throughout the several views, a representative thermal-conductive interface pad in accordance with the present invention is shown generally at 10 in perspective in FIG. 1 and in cross-section in FIG. 2. Within a thermal management assembly, pad 10 is interposable intermediate, for example, a pair of opposing heat transfer surfaces, such as from a heat sink or spreader and a heat-generating electronic component (see FIG. 4) to provide a low impedance, thermally-conductive pathway therebetween. In this regard, a first interface surface, referenced generally at 12, of pad 10 is disposable in conductive heat transfer contact with one of the heat transfer surfaces, with an opposing second interface surface, referenced generally at 14, of the pad 10 being disposable in conductive heat transfer contact with the other of the heat transfer surfaces.

Pad 10, which may have an overall thickness, referenced at "T" in the cross-sectional view of FIG. 2, of between about 4 mils or less and about 40 mils (100–1000 $\mu$m may be provided in the form of, or as formed from, a sheet, roll, tape, die-cut part, or the like. In basic construction, pad 10 is a laminate of a first layer, 20, formed of a thermally-conductive, flexible, lamellar graphite or tin foil material, and a second layer, 22, formed of a thermally-conductive, PCM.

For most applications, first layer 20 with have thickness, referenced at "$t_1$" in FIG. 2, of between about 1 mil or less and about 20 mils (25–500 $\mu$m), with second layer 22 having a thickness, referenced at "$t_2$" in FIG. 2, for most applications of between about 2–20 mils (50–500 $\mu$m). In such configuration, pad 10 generally will exhibit a thermal impedance, such as in accordance with ASTM D5470, of less than about 1° C.-in$^2$/W (6° C.-cm$^2$/W), and typically less than about 0.2° C.-in$^2$/W (1.2° C.-cm$^2$/W) and preferably not more than about 0.1° C.-in$^2$/W (0.6° C.-cm$^2$/W).

As is shown in the different views of FIGS. 1 and 2, first layer 20 has a first interior surface, 24, and an opposing first exterior surface, 26, which defines the first interface surface 12. First exterior surface 26 is provided in accordance with the precepts of the present invention as a conformable yet cleanly releasable surface for contact with one of the heat transfer surfaces of the management assembly (FIG. 4). Second layer 22, which may be coated on, bonded to, or otherwise joined and made integral with a sheet of the first layer 20 to provide the laminar structure of pad 10, has a second interior surface, 28, joined to the first interior surface 24, and an opposing second exterior layer 30. Second exterior layer 30 defines the second interface surface 14 of pad 10, and is adherable or otherwise bondable to the other one of the heat transfer surfaces of the management assembly as will be detailed hereinafter in connection with FIG. 3.

The lamellar, flexible graphite material of the first layer 20 may be provided as formed of intercalated graphite flake which is a rolled, calendered, molded, or otherwise compressed to form a sheet without the use of a binder. Such materials advantageously exhibit thermal stability, chemical resistance, low creep relaxation, and a relatively a high thermal conductivity in the "z" or "through sheet" direction of greater than about 7 W/m-K and a correspondingly low thermal impedance of between about 0.03–0.15° C.-in$^2$/W (0.18–0.9° C.-cm$^2$/W) at thicknesses of between about 5–20 mils (125–500 $\mu$m). Such materials, moreover, in being flexible, resilient, and compressible, are thereby able to conform to surface irregularities for lower thermal contact resistance and more efficient and faster heat transfer through the interface. Lamellar, flexible graphite sheet materials of the type herein involved are described further in U.S. Pat. No. 3,404,061, and are marketed commercially under the tradename "GRAFOIL®" by Graftech, Inc., Cleveland, Ohio. One suitable material is Grafoil® Grade T705 having a thickness about 5 mils (125 $\mu$m).

Alternatively, the thin, flexible tin material of the first layer 20 may be provided as formed of a tape, sheet or other layer of a relatively thin-gauge tin foil having, for example, a thickness of between about 1 mil or less and about 5 mils (25–125 $\mu$m) and, preferably, about 1 mil (25 $\mu$m) or less. Such materials typically will exhibit a thermal conductivity in the "z" or "through sheet" direction of about 60 w/m-K.

The thermally-conductive PCM of the second layer 22 may be formulated as a blend of a polymeric component and a thermally-conductive filler. By "phase-change," it is meant that the material is form-stable at normal room temperature, i.e., about 25° C., in a solid, semi-solid, glassy, or crystalline first phase, but is substantially conformable at an elevated temperature or temperature range in a liquid, semi-liquid, or otherwise viscous, generally-thixotropic second phase. Unlike conventional greases or waxes, PCM layer 22 advantageously is form-stable at normal room temperature such that pad 10 may be shipped and handled without causing the PCM to slump, sag, or run.

The phase transition temperature of the material, which may be its melting or glass transition temperature from a form stable first phase to a flowable second phase, is preferably between about 40–80° C., and is tailored to fall within the operating temperature of most electronic components. Particularly, the polymeric component may be a resin such as an acrylic, acrylamide, or copolymer or blend thereof, a pressure-sensitive adhesive (PSA), or a thermoplastic hot-melt such as a polyolefin, polyamide, polycarbonate, polyester, ethylene vinyl acetate, polyvinyl acetate, polyimide, or copolymer or blend thereof, a paraffinic or other wax, a blend of one or more such resins or one or more such waxes, or a blend of one or more resins and one or more waxes. Preferably, the polymeric component is formulated to be inherently tacky, such as by control of glass transition temperature, surface energy, viscosity, or other physical or chemical property, to enable the interface 10 to be bondable at room temperature under a moderate applied pressure of between about 5–50 psi (35–350 kPa) to the surface of the heat sink, spreader, or the like without the necessity of heating or the provision of a separate pressure-sensitive adhesive (PSA) or other adhesive layer.

The polymeric component generally forms a binder into which the thermally-conductive filler is dispersed. The filler is included within the binder in a proportion sufficient to provide the thermal conductivity desired for the intended application, and generally will be loaded at between about 20–80% by total weight of the PCM. The size and shape of the filler is not critical for the purposes of the present invention. In this regard, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.01–10 mil (0.25–250 μm), but may further vary depending upon the thickness of layer 22. The filler preferably is selected as being electrically-nonconductive such that layer 22 may provide a dielectric or electrically-insulating, but thermally-conductive barrier when interposed between an electronic component and a thermal dissipation member. Alternatively, the filler may be electrically-conductive in applications where electrical isolation is not required.

Suitable thermally-conductive fillers include boron nitride, titanium diboride, aluminum nitride, silicon carbide, graphite, metals such as silver, aluminum, and copper, metal oxides such as aluminum oxide, magnesium oxide, zinc oxide, beryllium oxide, and antimony oxide, and mixtures thereof. Such fillers characteristically exhibit a thermal conductivity of about 25–50 W/m-K. For reasons of economy, an aluminum oxide, i.e., alumina, may be used, while for reasons of improved thermal conductivity a boron nitride would be considered more preferred. Loaded with the thermally-conductive filler, the PCM typically will exhibit a thermal conductivity, per ASTM D5470, of between about 0.1–5 W/m-K and a thermal impedance, also per ASTM D5470, of less than about 1° C.-in$^2$/W (6° C.-cm$^2$/W)

Additional fillers and additives may be included in the PCM formulation depending upon the requirements of the particular application envisioned. Such fillers and additives may include conventional wetting agents or surfactants, opacifying or anti-foaming agents, chain extending oils, tackifiers, pigments, lubricants, stabilizers, flame retardants such as decabromodiphenyl oxide, and antioxidants. The PCM formulation may be compounded in a conventional mixing apparatus.

In an illustrative embodiment, the PCM of layer 22 may be formulated as a form-stable blend of: (a) between about 25–50% by weight of a pressure sensitive adhesive (PSA) component having a melting temperature of between about 90–100° C.; (b) between about 50% and about 75% by weight of an α-olefinic, thermoplastic component having a melting temperature of between about 30–60° C.; and (c) between about 20–80% by weight of alumina or boron nitride particles. "Melting temperature" is used herein in its broadest sense, and as interchangeable with "melting point," "softening temperature," and "softening point" to indicate a transition from a form-stable crystalline or glassy solid phase to a flowable liquid, semi-liquid, or otherwise viscous, thixotropic phase or melt which may be generally characterized as exhibiting intermolecular chain rotation. In this regard, the specified components typically will exhibit the stated softening or melting points as determined by means of differential scanning calorimetry (DSC) or differential thermal analysis (DTA). For amorphous materials not having a clearly defined melting peak, the term melting temperature also is used interchangeably with glass transition point at which the such materials may be characterized as exhibiting intramolecular chain rotation.

The PSA component generally may be of an acrylic-based, hot-melt variety such as a homopolymer, copolymer, terpolymer, interpenetrating network, or blend of an acrylic or (meth)acrylic acid, an acrylate such as butyl acrylate or other alcohol ester, and/or an amide such as acrylamide. The term "PSA" is used herein in its conventional sense to mean that the component is formulated has having a glass transition temperature, surface energy, and other properties such that it exhibits some degree of tack at normal room temperature. Acrylic hot-melt PSAs of such type are marketed commercially by Heartland Adhesives, Germantown, Wis., under the trade designations "H600" and "H251."

The α-olefinic thermoplastic component preferably is a polyolefin which may be characterized as a "low melt" composition. A representative material of the preferred type is an amorphous polymer of a $C_{10}$ or higher alkene which is marketed commercially by Petrolite Corporation, Tulsa, Okla., under the trade designation "VYBAR® 260."

By varying the ratio of the PSA to the thermoplastic component within the specified limits, the thermal and viscometric properties of the PCM formulation may be tailored to provide controlled thermal and viscometric properties. In particular, the phase transition temperature and melt flow index or viscosity of the formulation may be selected for optimum thermal performance with respect to such variables as the operating temperature of the heat generating electronic component, the magnitude of any applied external pressure, and the configuration of the interface. Generally, a phase transition temperature of between about 40–80° C. is considered preferred for the interface material of the present invention.

In an alternative embodiment, a paraffinic wax or other natural or synthetic ester of a long-chain ($C_{16}$ or greater) carboxylic acid and alcohol having a melting temperature of from about 60–70° C. may be substituted for the thermoplastic and PSA components to comprise about 20–80% by weight of the formulation. A preferred wax is marketed commercially by Bareco Products of Rock Hill, S.C., under the trade designation "Ultraflex® Amber," and is compounded as a blend of clay-treated microcrystalline and amorphous constituents. In alternative, non-phase changing embodiment, the binder component is provided as cured silicone, urethane, or acrylic material.

In the production of commercial quantities of pad 10, the PCM of layer 22 may be compounded as an admixture of the polymeric components and thermally-conductive fillers under conditions of high shear in a roll mill or other mixer. After compounding, the admixture may be thinned with a solvent or other diluent or, in the case of a "hot-melt" formulation, heated to a temperature above the melting or glass transition temperature of the formulation. Thereafter, the PCM material may be coated on the interior surface 24 of first layer 20 in a conventional manner such as, for example, by a direct process such as spraying, knife coating, roller coating, casting, drum coating, dipping, dispensing, extrusion, screen printing, or like, or an indirect transfer process. After coating, the resultant material may be dried to flash the solvent or otherwise cured or cooled to develop an adherent film, coating, or other residue of the second layer 22 on the first layer 20. As a result of the inherent tack of the PCM or the flow thereof, an adhesive and/or mechanical bond may be developed between the first and second layers 20 and 22 to form the integral, laminate structure of pad 10. Alternatively, the second layer 22 may be separately formed and laminated under conditions of elevated temperature and/or pressure to the first layer 20 in a separate operation.

Although not required, a carrier or reinforcement member (not shown in FIGS. 1 and 2) optionally may be incorporated within layer 22 as an interlayer therewithin or intermediate layers 20 and 22 to provide increased tear resistance. Conventionally, such member may be provided as a film formed of a thermoplastic material such as a polyimide or polyetheretherketone (PEEK), a layer of a woven or non-woven, e.g., needled, fiberglass fabric, cloth, web, or mat, or an aluminum or other metal foil, screen, or expanded mesh. Such reinforcement may improve the physical strength of the layer 22 and pad 10 to better facilitate handling at higher ambient temperatures and die cutting into a variety of geometries. The reinforcement member typically will have a thickness of between about 0.5–5 mil (12.5–125 $\mu$m), with a thickness of about 2 mil (50 $\mu$m) being preferred for metal foils.

To the extent that the PCM of the second layer 22 is substantially non-tacky, i.e., having a dry or dead tack at room temperature, a separate PSA layer (not shown in FIGS. 1 and 2) may be provided on the exterior surface 30 thereof as a coating or the like having a thickness, for example, of between about 0.05–2 mil (1.25–50 $\mu$m). Depending upon the composition or surface energy of the heat transfer surface to which pad 10 is to be applied, such PSA layer may be formulated as a silicone or acrylic-based PSA component or resin optionally blended with a thermally-conductive filler. The term "PSA" is used herein in its conventional sense to mean that the composition is formulated has having a glass transition temperature, surface energy, and other properties such that it exhibits some degree of tack at normal room temperature. Generally, the PSA material will be selected to exhibit a lap or die shear adhesion, according to ASTM D1002 or Chomerics Test Procedure No. 54 (Parker Chomerics Division, Woburn, Mass.), respectively, of at least about 100 psi (0.7 MPa) to the substrate. Such adhesion may be developed from valence forces, mechanical interlocking action, or a combination thereof.

The acrylic-based PSA component may be a homopolymer, copolymer, terpolymer, interpenetrating network, or blend of an acrylic or (meth)acrylic acid, an acrylate such as butyl acrylate or other alcohol ester, and/or an amide such as acrylamide. The silicone-based PSA component may include a dry or wet film silicone resin or gum. Depending upon the formulation, the respective acrylic or silicone-based PSA components may form a binder into which the thermally-conductive filler is dispersed. The filler generally is loaded in the binder in a proportion sufficient to provide the thermal conductivity desired for the intended application, and may be of the type described hereinbefore in connection with PCM layer 22.

With continuing reference to FIGS. 1 and 2, for ease of handling and as a protective layer for shipping, a release liner, 40, may be provided over the PSA layer or, in the case of an inherent tacky PCM, over the exterior surface 30 of second layer 22. Exemplary release liners include face stocks or other films of polyolefins, plasticized polyvinyl chloride, polyesters, cellulosics, metal foils, composites, and waxed, siliconized, or other coated paper or plastic having a relatively low surface energy to be removable without appreciable lifting of the second layer 22 from the first layer 20. Depending upon the intended application or otherwise for automated dispensing, individual pre-cut pads 10 may be provided in a roll form as carried on a tape of the liner 40. Alternatively for automated application, a continuous tape of pad 10 may be supplied by adhering or otherwise laminating a tape of liner 40 to a length thereof.

Figure 3:
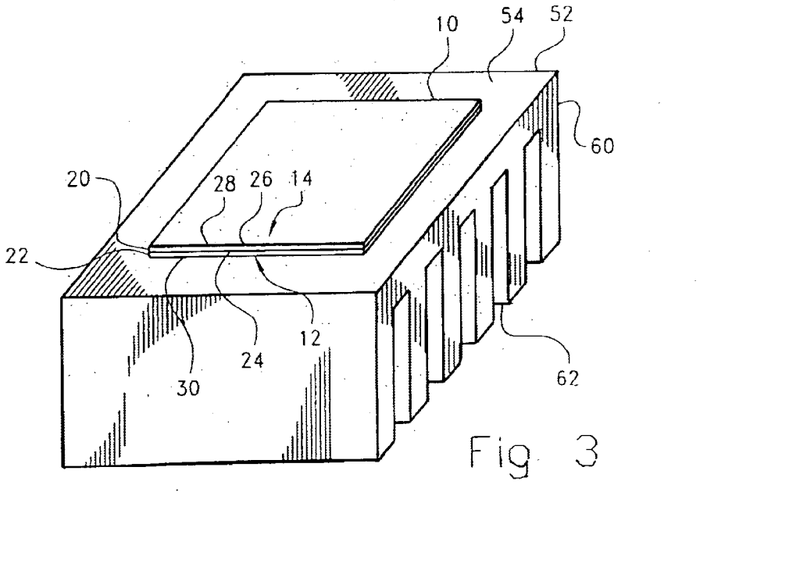
FIG. 3 is a perspective view showing the thermal interface of FIG. 1 as bonded to a plate-fin heat sink for use in a representative thermal management assembly.
Figure 4:
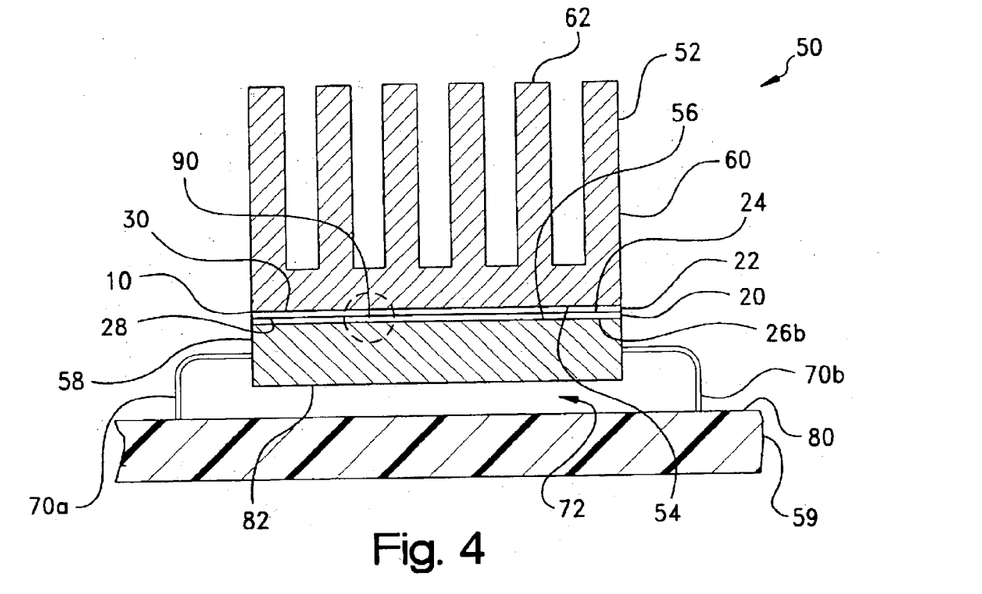
FIG. 4 is a cross-sectional view of a representative thermal management assembly wherein the heat sink and interface of FIG. 3 are disposed in heat transfer adjacency with a heat generating electronic component with the interface being interposed in conductive heat transfer contact with the heat sink and component to provide a low thermal impedance pathway therebetween.

Turning next to FIGS. 3 and 4, the use of pad 10 of the invention is illustrated in connection with the thermal management assembly referenced generally at 50 in FIG. 4 which includes a thermal dissipation member, 52, having a heat transfer surface, 54, which is disposed in conductive heat transfer adjacency with an opposing heat transfer surface, 56, of a heat-generating analog, digital, or other electronic component, 58, supported on an associated printed circuit board (PCB) or other substrate, 59. For illustrative purposes, thermal dissipation member 52 is shown to be a heat sink which may be of a plate-fin variety having a generally planar base portion, 60, from which extends a plurality of cooling fins, one of which is referenced at 62. Alternatively, thermal dissipation member 52 may be provided as a pin fin or other heat sink, heat exchanger, cold plate, or heat spreader structure, or even a printed circuit board, housing, or chassis. Dissipation member 52 typically will be formed of a ceramic material such as alumina, or a metal material such as aluminum or copper having a heat capacity relative to that of component 58 to be effective is dissipating thermal energy conducted or otherwise transferred therefrom.

With reference to FIG. 4, electronic component 58 may be an integrated microchip, microprocessor, transistor, or other power semiconductor device, an ohmic or other heat-generating subassembly such as a diode, relay, resistor, transformer, amplifier, diac, or capacitor, or, alternatively, another heat-generating source. Typically, component 58 will have an operating temperature range of from about 60–100° C. For the electrical connection of component 58 to board 59, one or more pair of solder balls, leads, or pins, one pair of which is referenced at 70a–b, are provided as extending from component 58 into a soldered or other connection with board 59. Leads 70 additionally may support component 58 above board 59 to define a gap, represented at 72, of about 3 mils (75 microns) therebetween. Alternatively, component 58 may be received directly on board 59.

Returning again to FIG. 3, with liner 40 (FIGS. 1 and 2) removed to expose, in the case of an inherently tacky PCM, the exterior surface 30 of second layer 22, pad 10 may be adhered at room temperature and under a moderate applied pressure of between about 5–50 psi (35–350 kPa), or otherwise bonded or attached to the heat transfer surface 54 of the dissipation member 52. In this regard, and as aforementioned, pad 10 may be die cut or otherwise cut to size from a larger sheet or from a roll or other length of tape stock.

With the applied pad 10, dissipation member 52 may be packaged and shipped as an integrated unit to an electronics manufacturer, assembler, or other user. The user then simply may position the exposed exterior surface 26 of first layer 20 on the heat transfer surface 56 of electronic component 58, and lastly apply a clip, clamp, screw, or other another means of external pressure (not shown) to dispose the dissipation member 52 in thermal adjacency with the component 58 as is shown in FIG. 4.

With continuing reference to FIG. 4, within assembly 50, pad 10 provides a low impedance conductive pathway for the transfer of heat from component 58 to dissipation member 52. Such pathway may be employed without or in conjunction with convective air circulation for effecting the cooling of component 58 and ensuring that the operating temperature thereof is maintained below specified limits. Although thermal dissipation member 52 is shown to be a separate heat sink member, board 59 itself may be used for such purpose by alternatively interposing pad 10 within the gap 72 between board surface 80 thereof and the opposing surface 82 of electronic component 58.

As mentioned, the thermally-conductive PCM of second layer 22 is formulated to be form-stable at normal room temperature, i.e., about 25° C., in a first phase, which is solid, semi-solid, glassy, or crystalline, but to be substantially conformable in service in a second phase, which is a liquid, semi-liquid, or otherwise viscous, generally-thixotropic melt, to the heat transfer surface 54 of dissipation member 52. The phase transition temperature of the PCM, which may be its melting or glass transition temperature, is preferably between about 40–80° C., and generally is tailored to fall within the operating temperature of electronic component 58.

Figure 5:
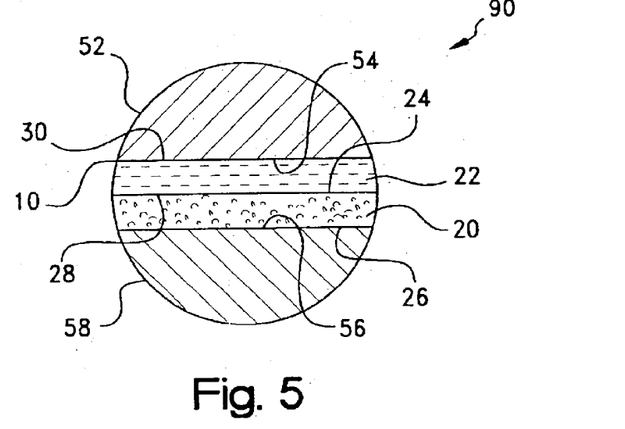
FIG. 5 is a magnified view of a portion of the interface pad of FIG. 4 showing the morphology of the PCM thereof in enhanced detail.

Further in this regard, reference may be had to FIG. 5 wherein an enlarged view of a portion of pad 10 referenced at 90 in FIG. 4 is shown to detail the morphology thereof during the energization of electronic component 58 effective to heat the pad 10 to a temperature which is above the phase transition temperature of the PCM which forms second layer 22. Second layer 22 accordingly is shown to have been melted or otherwise softened from a form-stable solid or semi-solid phase into a flowable or otherwise conformable liquid or semi-liquid viscous phase which may exhibit relative intermolecular chain movement. Such viscous phase provides increased surface area contact with the heat transfer surface 54 of dissipation member 52 for the exclusion of air pockets or other voids therefrom and a resultant improvement in both the efficiency and the rate of heat transfer through the pad 10. Moreover, as depending on, for example, the melt flow index or viscosity of the PCM and the magnitude of any externally-applied pressure such as from a clamp or clip, the interface gap between the heat transfer surfaces 54 and 56 may be narrowed to further improve the efficiency of the thermal transfer therebetween.

Any latent heat associated with the phase change of the PCM forming second layer 22 additionally contributes to the cooling of component 58. However, as the lamellar graphite or the tin foil material of first layer 20 is substantially unaffected by the heating of the pad 10, the exterior surface 26 of the first layer 20 advantageously may be released cleanly, i.e., without substantial residue, from the heat transfer surface 56 of the component 58 for rework or other disassembly of the assembly 50.

The Examples to follow, wherein all percentages and proportions are by weight unless otherwise expressly indicated, are illustrative of the practicing of the invention herein involved, but should not be construed in any limiting sense.

EXAMPLES

Example 1

A 5 mil (125 μm) thick layer of a boron-nitride filled PCM compound (Thermflow™ T725, Chomerics TEC Division, Parker Hannifin Corp., Hudson, N.H.) having a phase change temperature of about 58° C., a thermal impedance of about 0.03° C.-in$^2$/W (0.18° C.-cm$^2$/W) at about 50 psi (350 kPa), and an apparent thermal conductivity of about 0.7 W/m-K was laminated to one surface of a 5 mil (125 μm) thick sheet of a flexible graphite material (Grafoil® T705, Graftech, Inc., Cleveland, Ohio) having a thermal impedance of about 0.03° C.-in$^2$/W (0.18° C.-cm$^2$/W) at about 50 psi (350 kPa), and an apparent thermal conductivity of greater than about 7 W/m-K in the "z" or "through sheet" direction.

The thermal impedance of a sample of the interface material so prepared was determined using a modified ASTM D5470 procedure. A thermal impedance value of 0.091° C.-in$^2$/W (0.546° C.-cm$^2$/W) was measured which compares favorably to the reported values of commercial metal foil-PCM laminates of between about 0.12–0.33° C.-in$^2$/W (0.72–1.98° C.-cm$^2$/W).

Example 2

A layer of the Thermflow™ T725 PCM used in Example 1 was laminated to one surface of a 1 mil (25 μm) thick sheet of a flexible tin foil. The thermal impedance of this laminate was determined using a modified ASTM D5470 procedure. Comparative laminate samples also were prepared by coating the T725 PCM onto varying thickness of aluminum and copper foil, and on the Grafoil® T705 material used in Example 1. The results are shown in Table 1 below.

TABLE 1

| | Thickness (mils (μm)) | | | Impedance (C-in$^2$/W (° C.-cm$^2$/W)) | |
|---|---|---|---|---|---|
| Sample | PCM | Substrate | Total | 10 psi (70 KPa) | 20 psi (140 KPa) |
| Aluminum | 5.5 (140) | 1 (25) | 6.5 (165) | 0.19 (1.22) | 0.12 (0.77) |
| Aluminum | 3.5 (89) | 1 (25) | 4.5 (114) | N/A | 0.08 (0.52) |
| Aluminum | 9 (229) | 1 (25) | 10 (254) | 0.203 (1.31) | 0.125 (0.81) |
| Aluminum | 5 (127) | 2 (51) | 7 (178) | N/A | 0.16 (1.02) |
| Aluminum | 5 (127) | 3 (76) | 8 (203) | N/A | 0.18 (1.16) |
| Grafoil® | 5 (127) | 3 (76) | 8 (203) | 0.144 (0.93) | 0.087 (0.56) |
| Grafoil® | 5 (127) | 5 (127) | 10 (254) | 0.151 (0.97) | 0.12 (0.77) |
| Copper | 5 (127) | 1 (25) | 6 (152) | N/A | 0.18 (1.16) |
| Tin | 5.5 (140) | 1 (25) | 6.5 (165) | 0.145 (0.99) | 0.093 (0.60) |
| Lead | 4.5 (114) | 2 (51) | 6.5 (165) | 0.135 (0.87) | 0.102 (0.66) |

These data show that for similar thicknesses of the metal and PCM layers, a tin foil-PCM laminate according to the present invention exhibits improved thermal performance over a conventional aluminum foil-PCM laminate.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A laminar, thermally-conductive interface interposable intermediate a first heat transfer surface and an opposing second heat transfer surface to provide a thermally-conductive pathway therebetween, said interface having a having a first interface surface disposable in heat transfer contact with the first heat transfer surface and an opposing second interface surface disposable in heat transfer contact with the second heat transfer surface, said interface comprising:

a first layer formed of a flexible, lamellar graphite material consisting of intercalated graphite flake which is formed into a sheet without the use of a binder, said first layer having a first interior surface and a first exterior surface defining said first interface surface of said interface; and a second layer formed of a thermally-conductive phase-change material, said second layer having a second interior surface joined to the first interior surface of said first layer.

2. The interface of claim 1 wherein said first layer has a thickness of between about 2–20 mils (50–500 μm), and said second layer has a thickness of between about 2–20 mils (50–500 μm).

3. The interface of claim 1 wherein said interface has a thermal impedance of less than about 1° C.-in$^2$/W (6° C.-cm$^2$/W).

4. The interface of claim 1 wherein said first layer has a thermal impedance of between about 0.03–0.15° C.-in$^2$/W (0.18–0.9° C.-cm$^2$/W).

5. The interface of claim 1 wherein said second layer has a thermal impedance of less than about 0.2° C.-in$^2$/W (1.2° C.-cm$^2$/W).

6. The interface of claim 1 wherein:
the first interface surface of said interface is substantially cleanly releasable from heat transfer contact with the first heat transfer surface; and
the second interface surface of said interface is bondable to the second heat transfer surface.

7. The interface of claim 6 wherein:
said second layer has a second exterior surface which defines said second interface surface of said interface; and
said phase-change material of said second layer is inherently tacky such that the second exterior surface thereof is adherable by said phase-change material to the second heat transfer surface.

8. The interface of claim 1 wherein said phase-change material comprises an admixture of a polymeric component and one or more thermally-conductive fillers.

9. The interface of claim 8 wherein said one or more thermally-conductive fillers is selected from the group consisting of boron nitride, titanium diboride, aluminum nitride, silicon carbide, graphite, metals, metal oxides, and mixtures thereof.

10. The interface of claim 8 wherein said phase-change material comprises between about 20–80% by weight of said one or more thermally-conductive fillers.

11. The interface of claim 8 wherein said phase-change material has a thermal conductivity of between about 0.1–5.0 W/m-K.

12. The interface of claim 8 wherein said polymeric component comprises one or more resins, one or more waxes, or a blend of one or more waxes and one or more resins.

13. The interface of claim 12 wherein said resins or waxes are selected from the group consisting of thermoplastics, pressure sensitive adhesives, paraffinic waxes, and blends thereof.

14. The interface of claim 1 wherein said phase-change material is form-stable at normal room temperature of about 25° C. in a first phase and conformable to the second interface surface in a second phase, said phase-change material having a transition temperature above normal room temperature from said first phase to said second phase.

15. The interface of claim 14 wherein said transition temperature of said phase-change material is between about 40–80° C.

16. The interface of claim 14 wherein:
the first heat transfer surface is located on a heat-generating source having an operating temperature range above normal room temperature of from about 60–100° C.; and
said transition temperature of said phase-change material is within the operating temperature said heat-generating source.

17. The interface of claim 16 wherein:
said heat-generating source is an electronic component; and
the second heat transfer surface is located on a thermal dissipation member.

18. The interface of claim 17 wherein the thermal dissipation member is a heat sink or a circuit board.

19. A thermal management assembly comprising:
a first heat transfer surface;
a second heat transfer surface opposing said first heat transfer surface; and
a laminar, thermally-conductive interface interposed intermediate said first and said second heat transfer surface to provide a thermally-conductive pathway therebetween, said interface having a first interface surface disposed in heat transfer contact with said first heat transfer surface and an opposing second interface surface disposed in beat transfer contact with said second heat transfer surface, said interface comprising:
a first layer formed of a flexible, lamellar graphite material consisting of intercalated graphite flake which is formed into a sheet without the use of a binder, said first layer having a first interior surface and a first exterior surface defining said first interface surface of said interface; and
a second layer formed of a thermally-conductive phase-change material, said second layer having a second interior surface joined to the first interior surface of said first layer.

20. The assembly of claim 19 wherein said first layer has a thickness of between about 2–20 mils (50–500 μm), and said second layer has a thickness of between about 2–20 mils (50–500 μm).

21. The assembly of claim 19 wherein said interface has a thermal impedance of less than about 1° C.-in$^2$/W (6° C.-cm$_2$/W).

22. The assembly of claim 19 wherein said first layer has a thermal impedance of between about 0.03–0.15° C.-in$^2$/W (0.18–0.9° C.-cm$^2$/W).

23. The assembly of claim 19 wherein said second layer has a thermal impedance of less than about 0.2° C.-in$^2$/W (1.2° C.-cm$^2$/W).

24. The assembly of claim 19 wherein:
said first interface surface of said interface is substantially cleanly releasable from heat transfer contact with said first heat transfer surface; and
said second interface surface of said interface is bondable to said second heat transfer surface.

25. The assembly of claim 24 wherein:
said second layer has a second exterior surface which defines said second interface surface of said interface; and
said phase-change material of said second layer is inherently tacky and adheres said second exterior surface thereof to said second heat transfer surface.

26. The assembly of claim 19 wherein said phase-change material comprises an admixture of a polymeric component and one or more thermally-conductive fillers.

27. The assembly of claim 26 wherein said one or more thermally-conductive fillers is selected from the group consisting of boron nitride, titanium diboride, aluminum nitride, silicon carbide, graphite, metals, metal oxides, and mixtures thereof.

28. The assembly of claim 26 wherein said phase-change material comprises between about 20–80% by weight of said one or more thermally-conductive fillers.

29. The assembly of claim 26 wherein said phase-change material has a thermal conductivity of between about 0.1–5 W/m-K.

30. The assembly of claim 26 wherein said polymeric component comprises one or more resins, one or more waxes, or a blend of one or more waxes and one or more resins.

31. The assembly of claim 30 wherein said resins or waxes are selected from the group consisting of thermoplastics, pressure sensitive adhesives, paraffinic waxes, and blends thereof.

32. The assembly of claim 19 wherein said phase-change material is form-stable at normal room temperature of about 25° C. in a first phase and conformable to the second interface surface in a second phase, said phase-change material having a transition temperature above normal room temperature from said first phase to said second phase.

33. The assembly of claim 32 wherein said transition temperature of said phase-change material is between about 40–80° C.

34. The assembly of claim 32 wherein:
said first heat transfer surface is located on a heat-generating source having an operating temperature range above normal room temperature of from about 60–100° C.; and
said transition temperature of said phase-change material is within the operating temperature said heat-generating source.

35. The assembly of claim 34 wherein:
said heat-generating source is an electronic component; and
said second heat transfer surface is located on a thermal dissipation member.

36. The assembly of claim 35 wherein said thermal dissipation member is a heat sink or a circuit board.

37. A laminar, thermally-conductive interface interposable intermediate a first heat transfer surface and an opposing second heat transfer surface to provide a thermally-conductive pathway therebetween, said interface having a first interface surface disposable in heat transfer contact with the first heat transfer surface and an opposing second interface surface disposable in heat transfer contact with the second heat transfer surface, said interface comprising:
a first layer consisting of a flexible tin foil material, said first layer having a first interior surface and a first exterior surface defining said first interface surface of said interface; and
a second layer formed of a thermally-conductive phase-change material, said second layer having a second interior surface joined to the first interior surface of said first layer.

38. The interface of claim 37 wherein said first layer has a thickness of between about 1 mil (25 μm) or less, and said second layer has a thickness of between about 2–20 mils (50–500 μm).

39. The interface of claim 37 wherein said interface has a thermal impedance of less than about 1° C.-in$^2$/W (6° C.-cm$^2$/W).

40. The interface of claim 37 wherein said first layer has a thermal conductivity of about 60 W/m-K.

41. The interface of claim 37 wherein said second layer has a thermal impedance of less than about 0.2° C.-in$^2$/W (1.2° C.-cm$^2$/W).

42. The interface of claim 37 wherein:
the first interface surface of said interface is substantially cleanly releasable from heat transfer contact with the first heat transfer surface; and
the second interface surface of said interface is bondable to the second heat transfer surface.

43. The interface of claim 42 wherein:
said second layer has a second exterior surface which defines said second interface surface of said interface; and
said phase-change material of said second layer is inherently tacky such that the second exterior surface thereof is adherable by said phase-change material to the second heat transfer surface.

44. The interface of claim 37 wherein said phase-change material comprises an admixture of a polymeric component and one or more thermally-conductive fillers.

45. The interface of claim 44 wherein said one or more thermally-conductive fillers is selected from the group consisting of boron nitride, titanium diboride, aluminum nitride, silicon carbide, graphite, metals, metal oxides, and mixtures thereof.

46. The interface of claim 44 wherein said phase-change material comprises between about 20–80% by weight of said one or more thermally-conductive fillers.

47. The interface of claim 44 wherein said phase-change material has a thermal conductivity of between about 0.1–5.0 W/m-K.

48. The interface of claim 44 wherein said polymeric component comprises one or more resins, one or more waxes, or a blend of one or more waxes and one or more resins.

49. The interface of claim 48 wherein said resins or waxes are selected from the group consisting of thermoplastics, pressure sensitive adhesives, paraffinic waxes, and blends thereof.

50. The interface of claim 37 wherein said phase-change material is form-stable at normal room temperature of about 25° C. in a first phase and conformable to the second interface surface in a second phase, said phase-change material having a transition temperature above normal room temperature from said first phase to said second phase.

51. The interface of claim 50 wherein said transition temperature of said phase-change material is between about 40–80° C.

52. The interface of claim 50 wherein:
the first heat transfer surface is located on a heat-generating source having an operating temperature range above normal room temperature of from about 60–100° C.; and
said transition temperature of said phase-change material is within the operating temperature said heat-generating source.

53. The interface of claim 52 wherein:
said heat-generating source is an electronic component; and
the second heat transfer surface is located on a thermal dissipation member.

54. The interface of claim 53 wherein the thermal dissipation member is a heat sink or a circuit board.

55. A thermal management assembly comprising:
a first heat transfer surface;
a second heat transfer surface opposing said first heat transfer surface; and
a laminar, thermally-conductive interface interposed intermediate said first and said second heat transfer surface to provide a thermally-conductive pathway therebetween, said interface having a first interface surface disposed in heat transfer contact with said first heat transfer surface and an opposing second interface surface disposed in heat transfer contact with said second heat transfer surface, said interface comprising:
a first layer consisting of a flexible tin foil material, said first layer having a first interior surface and a first exterior surface defining said first interface surface of said interface; and
a second layer formed of a thermally-conductive phase-change material, said second layer having a second interior surface joined to the first interior surface of said first layer.

56. The assembly of claim 55 wherein said first layer has a thickness of about 1 mil (25 μm) or less, and said second layer has a thickness of between about 2–20 mils (50–500 μm).

57. The assembly of claim 55 wherein said interface has a thermal impedance of less than about 1° C.-in²/W (6° C.-cm²/W).

58. The assembly of claim 55 wherein said first layer has a thermal conductivity of about 60 W/m-K.

59. The assembly of claim 55 wherein said second layer has a thermal impedance of less than about 0.2° C.-in²/W (1.2° C.-cm²/W).

60. The assembly of claim 55 wherein:
said first interface surface of said interface is substantially cleanly releasable from heat transfer contact with said first heat transfer surface; and
said second interface surface of said interface is bondable to said second heat transfer surface.

61. The assembly of claim 60 wherein:
said second layer has a second exterior surface which defines said second interface surface of said interface; and
said phase-change material of said second layer is inherently tacky and adheres said second exterior surface thereof to said second heat transfer surface.

62. The assembly of claim 55 wherein said phase-change material comprises an admixture of a polymeric component and one or more thermally-conductive fillers.

63. The assembly of claim 62 wherein said one or more thermally-conductive fillers is selected from the group consisting of boron nitride, titanium diboride, aluminum nitride, silicon carbide, graphite, metals, metal oxides, and mixtures thereof.

64. The assembly of claim 62 wherein said phase-change material comprises between about 20–80% by weight of said one or more thermally-conductive fillers.

65. The assembly of claim 62 wherein said phase-change material has a thermal conductivity of between about 0.1–5 W/m-K.

66. The assembly of claim 62 wherein said polymeric component comprises one or more resins, one or more waxes, or a blend of one or more waxes and one or more resins.

67. The assembly of claim 66 wherein said resins or waxes are selected from the group consisting of thermoplastics, pressure sensitive adhesives, paraffinic waxes, and blends thereof.

68. The assembly of claim 55 wherein said phase-change material is form-stable at normal room temperature of about 25° C. in a first phase and conformable to the second interface surface in a second phase, said phase-change material having a transition temperature above normal room temperature from said first phase to said second phase.

69. The assembly of claim 68 wherein said transition temperature of said phase-chance material is between about 40–80° C.

70. The assembly of claim 68 wherein:
said first heat transfer surface is located on a heat-generating source having an operating temperature range above normal room temperature of from about 60–100° C.; and
said transition temperature of said phase-change material is within the operating temperature said heat-generating source.

71. The assembly of claim 70 wherein:
said heat-generating source is an electronic component; and
said second heat transfer surface is located on a thermal dissipation member.

72. The assembly of claim 71 wherein said thermal dissipation member is a heat sink or a circuit board.

* * * * *